United States Patent
Chang et al.

(10) Patent No.: US 12,538,827 B2
(45) Date of Patent: Jan. 27, 2026

(54) SEMICONDUCTOR STRUCTURE

(71) Applicant: Taiwan Semiconductor Manufacturing Company, Ltd., Hsinchu (TW)

(72) Inventors: Mao-Yen Chang, Kaohsiung (TW); Yu-Chia Lai, Miaoli County (TW); Cheng-Shiuan Wong, Hsinchu (TW); Ting Hao Kuo, Hsinchu (TW); Ching-Hua Hsieh, Hsinchu (TW); Hao-Yi Tsai, Hsinchu (TW); Kuo-Lung Pan, Hsinchu (TW); Hsiu-Jen Lin, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 14 days.

(21) Appl. No.: 18/592,523

(22) Filed: Mar. 1, 2024

(65) Prior Publication Data

US 2024/0203936 A1    Jun. 20, 2024

Related U.S. Application Data

(62) Division of application No. 17/460,319, filed on Aug. 30, 2021, now Pat. No. 11,942,451.

(51) Int. Cl.
| | |
|---|---|
| *H01L 23/00* | (2006.01) |
| *H01L 21/56* | (2006.01) |
| *H01L 23/544* | (2006.01) |
| *H01L 23/58* | (2006.01) |

(52) U.S. Cl.
CPC ............ *H01L 24/96* (2013.01); *H01L 21/561* (2013.01); *H01L 21/568* (2013.01); *H01L 23/544* (2013.01); *H01L 23/562* (2013.01); *H01L 23/585* (2013.01); *H01L 24/24* (2013.01); *H01L 24/82* (2013.01); *H01L 24/73* (2013.01); *H01L 2223/5442* (2013.01); *H01L 2223/54426* (2013.01); *H01L 2224/24137* (2013.01); *H01L 2224/24146* (2013.01); *H01L 2224/24265* (2013.01); *H01L 2224/73204* (2013.01); *H01L 2224/73209* (2013.01); *H01L 2224/73217* (2013.01); *H01L 2224/82005* (2013.01); *H01L 2224/82947* (2013.01)

(58) Field of Classification Search
None
See application file for complete search history.

(56) References Cited

U.S. PATENT DOCUMENTS

2008/0211109 A1*   9/2008   Kumagai .............. H01L 23/562
                                         257/774
2021/0098328 A1*   4/2021   Chu ........................ H01L 21/56

* cited by examiner

*Primary Examiner* — Jay C Chang
(74) *Attorney, Agent, or Firm* — JCIPRNET

(57) ABSTRACT

A semiconductor structure includes a functional die, a dummy die, a conductive feature, a seal ring and an alignment mark. The dummy die is electrically isolated from the functional die. The conductive feature is electrically connected to the functional die. The seal ring is disposed aside the conductive feature. The alignment mark is disposed between the seal ring and the conductive feature, and the alignment mark is electrically isolated from the dummy die, the conductive feature and the seal ring.

20 Claims, 20 Drawing Sheets

SEMICONDUCTOR STRUCTURE

CROSS-REFERENCE TO RELATED APPLICATION

This is a divisional application of and claims the priority benefit of U.S. application Ser. No. 17/460,319, filed on Aug. 30, 2021. The entirety of the above-mentioned patent application is hereby incorporated by reference herein and made a part of this specification.

BACKGROUND

In recent years, the semiconductor industry has experienced rapid growth due to continuous improvement in integration density of various electronic devices, e.g., transistors, diodes, resistors, capacitors, etc. For the most part, this improvement in integration density has come from successive reductions in minimum feature size, which allows more devices to be integrated into a given area.

These smaller electronic devices also require smaller packages that occupy less area than previous packages. One of the promising semiconductor packages is a "chip on wafer on substrate (CoWoS)" structure for advanced products targeting cloud computing, data center, and super computer applications. Although the existing semiconductor packages have been generally adequate for their intended purposes, they have not been entirely satisfactory in all respects.

DETAILED DESCRIPTION

Figure 1A:
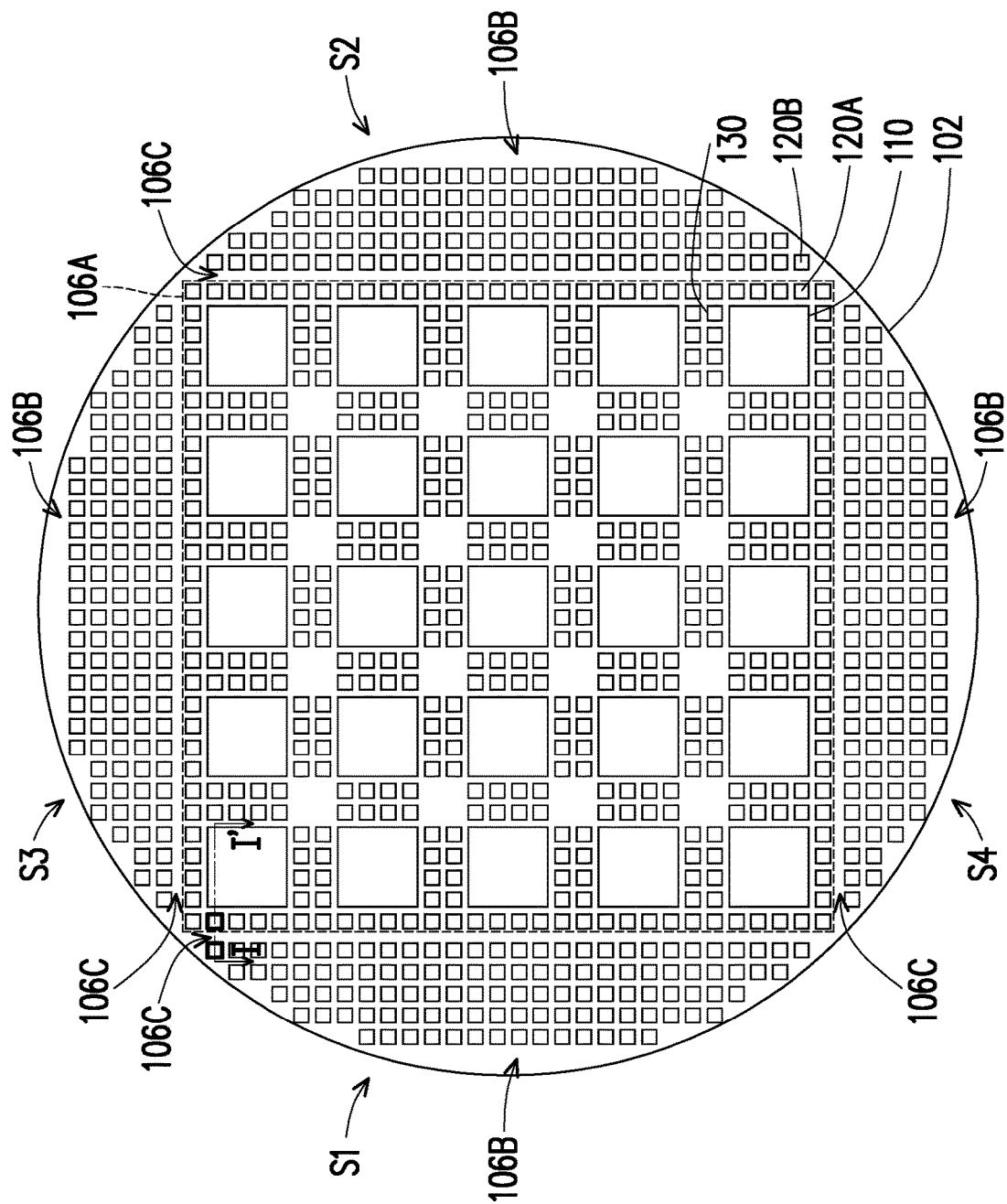
FIG. 1A to FIG. 1D are simplified top views illustrating a method of forming a semiconductor structure in accordance with some embodiments of the disclosure.

The following disclosure provides many different embodiments, or examples, for implementing different features of the provided subject matter. Specific examples of components and arrangements are described below to simplify the disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "top," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 1B:
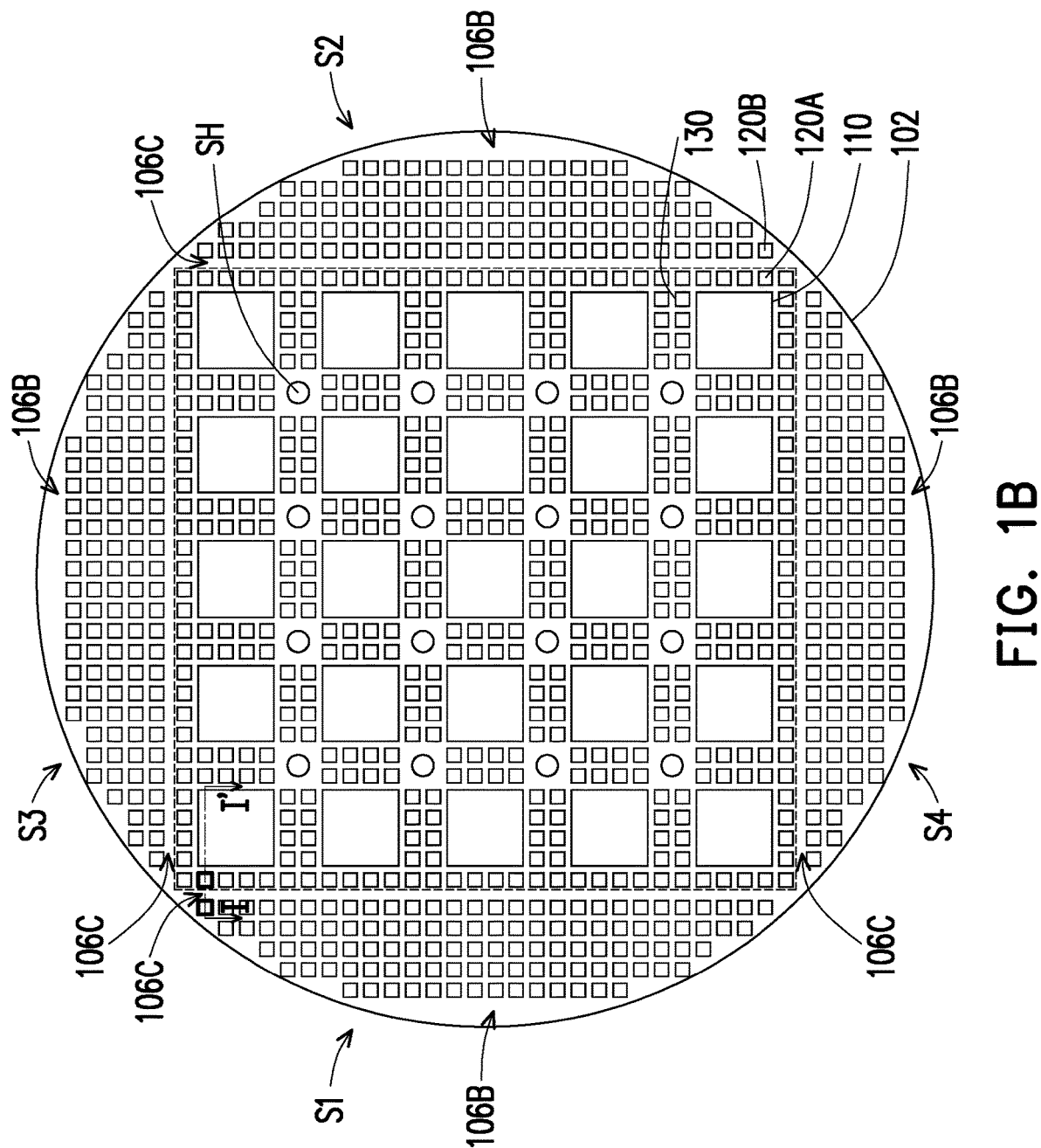

FIG. 1A to FIG. 1D are simplified top views illustrating a method of forming a semiconductor structure in accordance with some embodiments of the disclosure. FIG. 2A to FIG. 2H are schematic cross-sectional views illustrating a method of forming a semiconductor structure along line I-I' of FIG. 1A to FIG. 1D in accordance with some embodiments of the disclosure. FIG. 3A and FIG. 3B are simplified and partially enlarged views of one side of a periphery region of FIGS. 1A and 1C. For clarity, in FIG. 1A to FIG. 1D, only a carrier, dies, and screw holes are shown, and other elements are omitted. Referring to FIGS. 1A and 2A, a plurality of functional dies 110 and a plurality of dummy dies 120A, 120B are provided over a carrier 102. In some embodiments, the carrier 102 is a glass carrier or any suitable carrier for carrying a plurality of semiconductor dies used in the method of fabricating the semiconductor structure. In some embodiments, the carrier 102 is coated with a debond layer 104. The material of the debond layer 104 may be any material suitable for bonding and de-bonding the carrier 102 from the above layer(s) or any die(s) disposed thereon.

In some embodiments, the debond layer 104 includes a dielectric material layer made of a dielectric material including any suitable polymer-based dielectric material (such as benzocyclobutene ("BCB"), polybenzoxazole ("PBO")). In alternative embodiments, the debond layer 104 includes a dielectric material layer made of an epoxy-based thermal-release material, which loses its adhesive property when heated, such as a light-to-heat-conversion (LTHC) release coating film. In alternative embodiments, the debond layer 104 includes a dielectric material layer made of an ultra-violet (UV) glue, which loses its adhesive property when exposed to UV lights. In certain embodiments, the debond layer 104 is dispensed as a liquid and cured, or is a laminate film laminated onto the carrier 102, or may be the like. The top surface of the debond layer 104, which is opposite to a bottom surface contacting the carrier 102, may be levelled and may have a high degree of coplanarity.

In alternative embodiments, a buffer layer (not shown) is coated on the debond layer 104, where the debond layer 104 is sandwiched between the buffer layer and the carrier 102, and the top surface of the buffer layer may further provide a high degree of coplanarity. In some embodiments, the buffer layer is a dielectric material layer. In some embodiments, the buffer layer is a polymer layer which is made of polyimide, BCB, PBO, or any other suitable polymer-based dielectric material. In some embodiments, the buffer layer is an Ajinomoto Buildup Film (ABF), Solder Resist film (SR), or the like. In other words, the buffer layer is optional and may be omitted based on the demand, and the disclosure is not limited thereto.

Then, the functional dies 110 and the dummy dies 120A, 120B may be provided over the debond layer 104. In some embodiments, the functional dies 110 and the dummy dies 120A, 120B are picked and placed on the debond layer 104. In some embodiments, a main region 106A and a periphery region 106B are separated by a saw street 106C therebetween. The periphery region 106B may surround the main region 106A. In some embodiments, the periphery region 106B is also referred to an edge region or a chamfered edge region. The functional dies 110 and the dummy dies 120A are disposed in the main region 106A, and the dummy dies 120B are disposed in the periphery region 106B. The functional dies 110 may be arranged in an array in the main region 106A. For example, the functional dies 110 are arranged in an array including a plurality of rows and columns, the row is paralleled to a first direction, and the column is paralleled to a second direction perpendicular to the first direction. In some embodiments, the sidewalls of the functional dies 110 in the same row are extended in the first direction and aligned with one another, and similarly, the sidewalls of the functional dies 110 in the same column are extended in the second direction and aligned with one another. The second direction may be perpendicular to the first direction. The first direction and the second direction are X direction and Y direction, for example. The dummy dies 120B may be disposed in the periphery region 106B aside the functional dies 110, and the dummy dies 120A may be disposed between the functional dies 110 and the dummy dies 120B, respectively. The saw street 106C is disposed at each side S1, S2, S3, S4 of the periphery region 106B. For example, there are four saw streets 106C at four sides S1, S2, S3, S4 of the periphery region 106B. The saw streets 106C have longitudinal directions parallel to the first direction or the second direction. In some embodiments, each saw street 106C is disposed between the dummy dies 120A, 120B adjacent to each other. Beside the dummy dies 120A, 120B, a plurality of dummy dies 130 may be disposed between the functional dies 110 in the main region 106A.

The functional dies 110 and the dummy dies 120A, 120B, 130 are, for example, semiconductor dies. In some embodiments, a die attach film (not shown) is formed between each of the functional dies 110 and the dummy dies 120A, 120B, 130 and the debond layer 104 for adhering the functional dies 110 and the dummy dies 120A, 120B, 130 onto the carrier 102. In some embodiments, each of the functional dies 110 includes a semiconductor substrate 110a, a plurality of conductive pads 110b distributed on an active surface (not shown) of the semiconductor substrate 110a, a passivation layer 110c covering the active surface, a plurality of conductive pillars 110d and a protection layer 110e. In some embodiments, the passivation layer 110c is conformally formed over the conductive pads 110b and has a plurality of openings to expose portions of the conductive pads 110b respectively. The conductive pillars 110d are partially disposed in the openings of the passivation layer 110c to electrically connect the conductive pads 110b and partially disposed on the top surface of the passivation layer 110c. In some embodiments, the protection layer 110e is formed on the passivation layer 110c and the conductive pillars 110d. The semiconductor substrate 110a may be a bulk silicon substrate or a silicon-on-insulator (SOI) substrate, and further includes active components (e.g., transistors or the like) and optionally passive components (e.g., resistors, capacitors, inductors or the like) formed therein. The conductive pads 110b may be aluminum pads, copper pads or other suitable metal pads. The passivation layer 110c may be a silicon oxide layer, a silicon nitride layer, a silicon oxynitride layer or a dielectric layer formed of any suitable dielectric materials. In some embodiments, the conductive pillars 110d are formed on the conductive pads 110b by plating. In some embodiments, the protection layer 110e covers the conductive pillars 110d to protect the conductive pillars 110d. The protection layer 110e may be a benzocyclobutene (BCB) layer, a polyimide layer, a polybenzoxazole (PBO) layer, or a dielectric layer formed by other suitable polymers.

In some embodiments, the functional dies 110 are the same types of dies or different types of dies. The functional dies 110 may be selected from application-specific integrated circuit (ASIC) chips, analog chips (for example, wireless and radio frequency chips), digital chips (for example, a baseband chip), integrated passive devices (IPDs), voltage regulator chips, sensor chips, memory chips, or the like. The disclosure is not limited thereto. A size of the functional dies 110 may be the same or different according to the requirements.

In some embodiments, the dummy dies 120A, 120B, 130 are free of active devices and passive devices and do not provide addition electrical functionality to a semiconductor structure to be formed. In other words, there is no conductive pattern such as routing or dielectric material such as extreme low-k (ELK) dielectrics in the dummy dies 120A, 120B, 130. The dummy dies 120A, 120B, 130 may be merely composed of semiconductor substrate. In some embodiments, a material of the semiconductor substrates may be the same as or different from the semiconductor substrate 110a of the functional dies 110. A size of the dummy dies 120A, 120B, 130 may be adjusted according to the requirements.

Figure 2A:
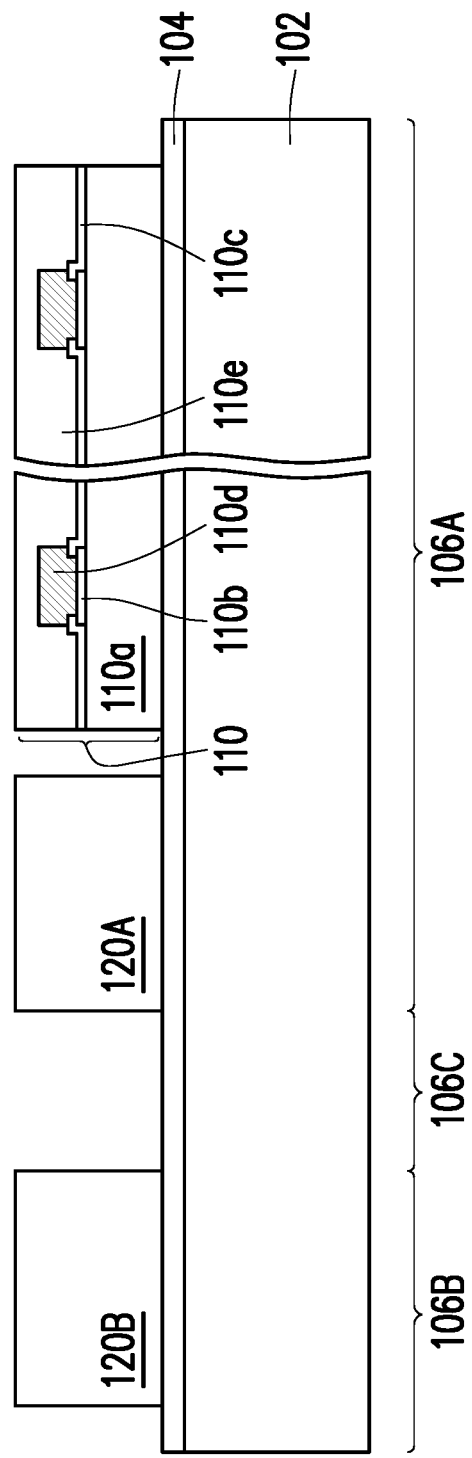
FIG. 2A to FIG. 2H are schematic cross-sectional views illustrating a method of forming a semiconductor structure in accordance with some embodiments of the disclosure.
Figure 2B:
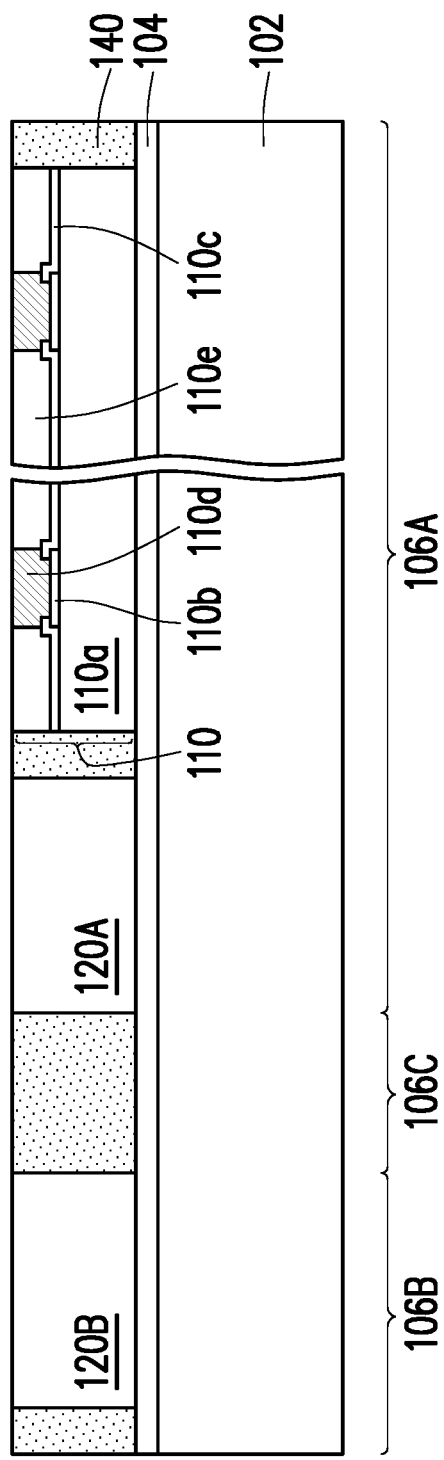
Figure 3A:
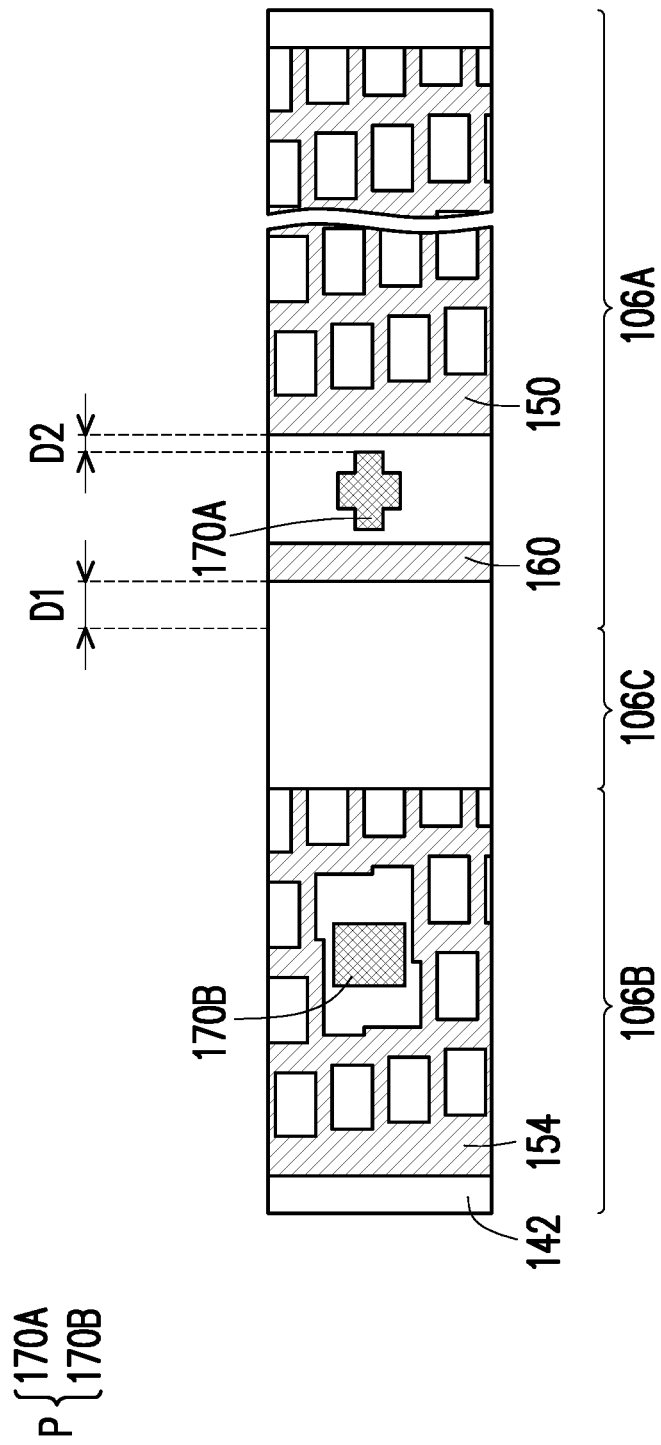
FIG. 3A and FIG. 3B are simplified enlarged views of one side of a periphery region of FIG. 1A and FIG. 1C.
Figure 3B:
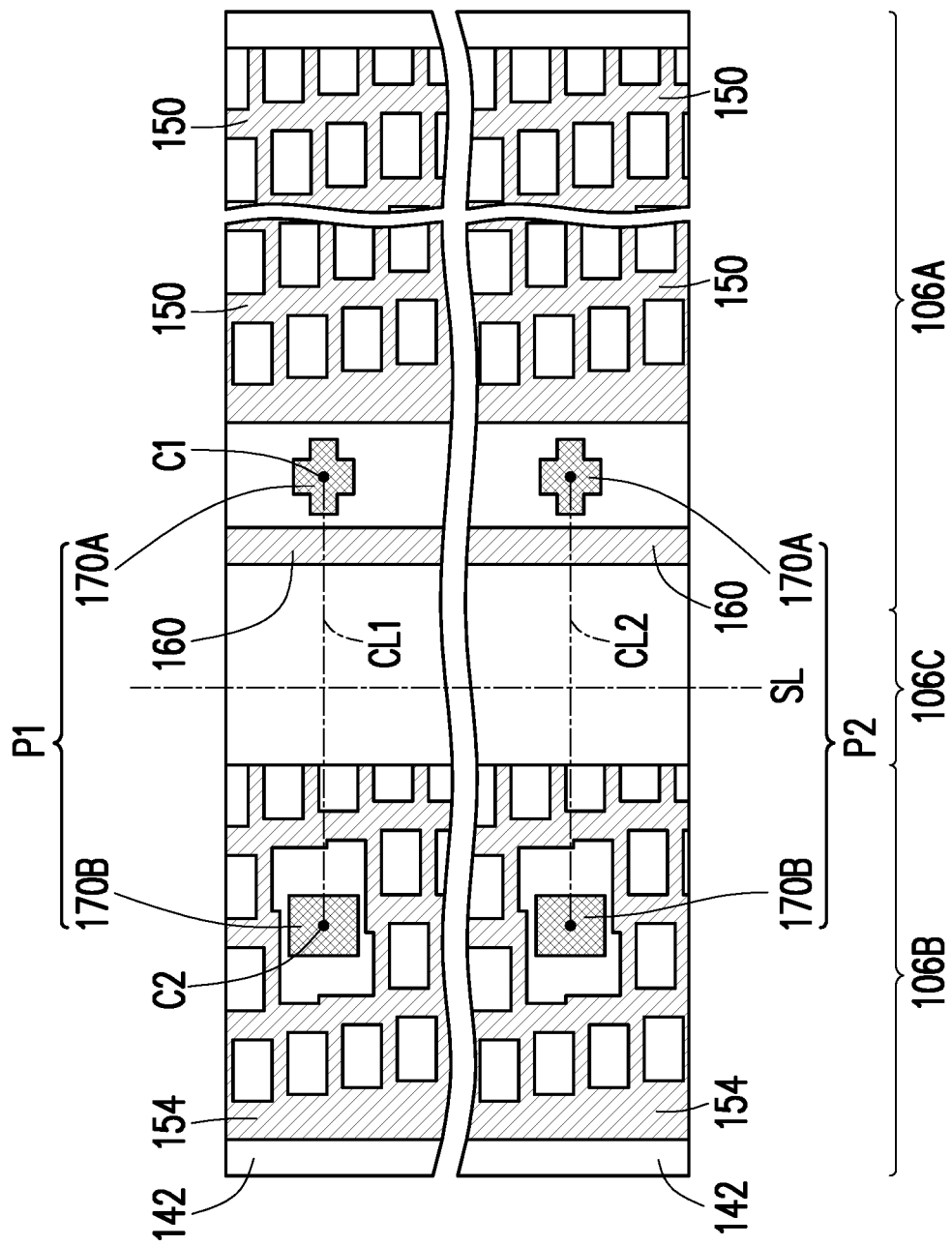

Referring to FIGS. 1A and 2B, an insulating layer 140 is formed on the functional dies 110 and the dummy dies 120A, 120B, 130, to encapsulate the functional dies 110 and the dummy dies 120A, 120B, 130. In some embodiments, an insulating material is formed through a compression molding process and fills up the gaps between the functional dies 110 and the dummy dies 120A, 120B, 130. At this stage, the conductive pillars 110d and the protection layer 110e of the functional dies 110 are encapsulated by and well protected by the insulating material, for example. In other words, the conductive pillars 110d and the protection layer 110e of the functional dies 110 are not revealed and are well protected by the insulating material. Then, the insulating material is partially removed to form the insulating layer 140 and expose the functional dies 110 and the dummy dies 120A, 120B, 130. In some embodiments, the insulating material and the protection layer 110e are grinded or polished by a planarization step. For example, the planarization step is performed through a mechanical grinding process and/or a chemical mechanical polishing (CMP) process until top surfaces of the conductive pillars 110d of the functional dies 110 and top surfaces of the dummy dies 120A, 120B, 130 are revealed. In some embodiments, top portions of the dummy dies 120A, 120B, 130 are also grinded or polished by the planarization step. In some embodiments, a top surface of the insulating layer 140, the top surfaces of the conductive pillars 110d of the functional dies 110 and top surfaces of the dummy dies 120A, 120B, 130 are substantially coplanar and levelled with one another.

In some embodiments, the insulating layer 140 includes polymers (such as epoxy resins, phenolic resins, silicon-containing resins, or other suitable resins), dielectric materials having low permittivity (Dk) and low loss tangent (Df) properties, or other suitable materials. In alternative embodiments, the insulating layer 140 include an acceptable insulating encapsulation material. In some embodiments, the insulating layer 140 further include inorganic filler or inorganic compound (e.g. silica, clay, and so on) which can be added therein to optimize coefficient of thermal expansion (CTE) of the insulating material. The disclosure is not limited thereto. In some embodiments, after the mechanical grinding step or chemical mechanical polishing (CMP) step, a cleaning step is optionally performed. For example, the cleaning step is preformed to clean and remove the residue generated from the planarization step. However, the disclosure is not limited thereto, and the planarization step may be performed through any other suitable methods.

Figure 2C:
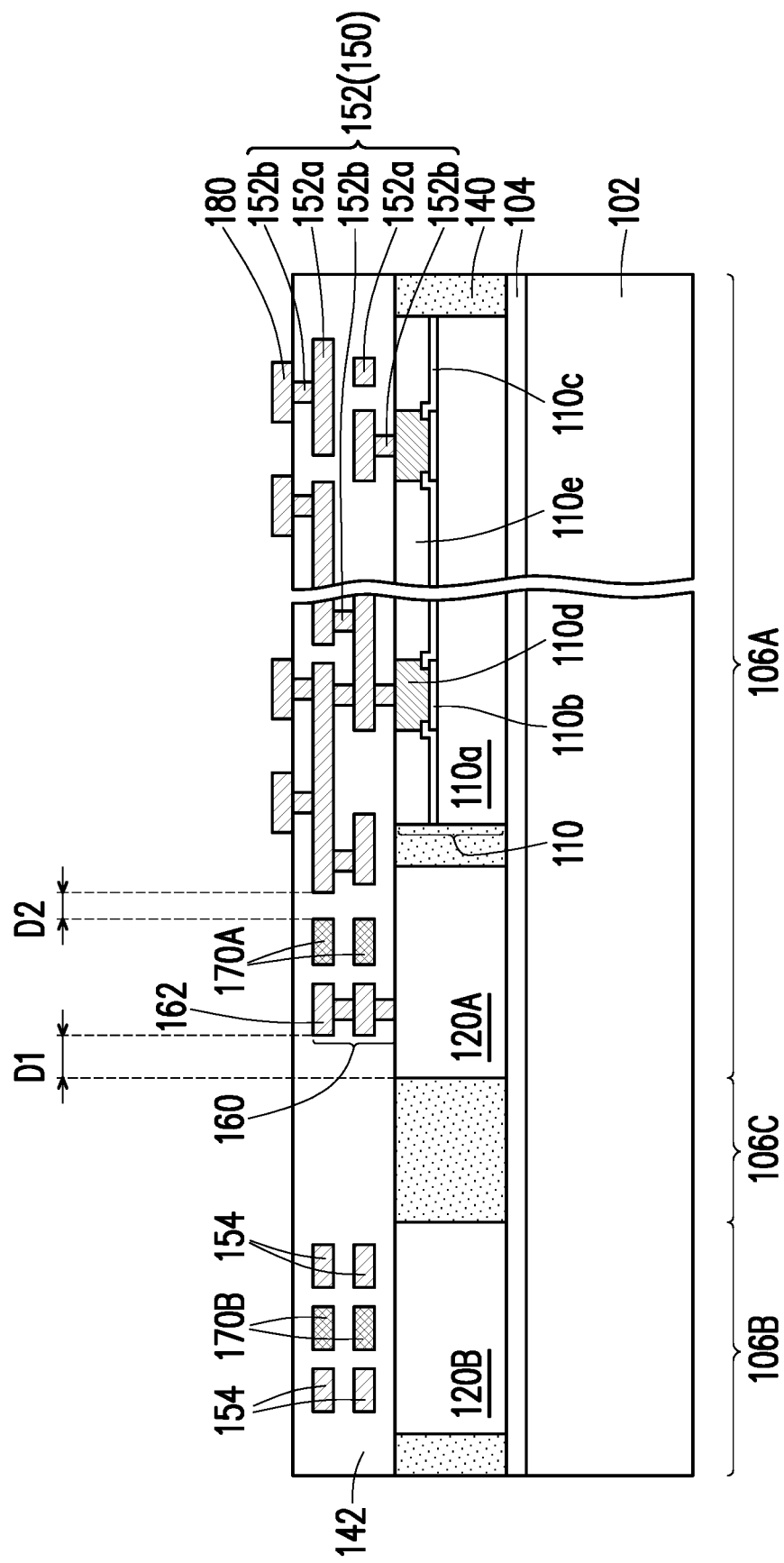

Referring to FIGS. 1A, 2C and 3A, a redistribution structure 150 is formed over the functional die 110, a seal ring 160 and at least one alignment mark 170A are formed over the dummy die 120A, and at least one alignment mark 170B is formed over the dummy die 120B. The redistribution structure 150, the seal ring 160 and the alignment marks 170A, 170B are formed in a dielectric layer 142 over the top surfaces of the insulating layer 140, the functional die 110 and the dummy dies 120A, 120B, 130. In some embodiments, the dielectric layer 142 includes an inter-layer dielectric (ILD) layer on the functional die 110 and the dummy dies 120A, 120B, 130, and at least one inter-metal dielectric (IMD) layer over the inter-layer dielectric layer. In some embodiments, the dielectric layer 142 includes silicon oxide, silicon oxynitride, silicon nitride, a low dielectric constant (low-k) material or a combination thereof. The dielectric layer 142 may be a single layer or a multiple-layer structure. In some embodiments, the redistribution structure 150 is disposed over and electrically connected to the functional die 110. In some embodiments, the redistribution structure 150 is partially overlapped with the underlying dummy die 120A when projected onto a surface of the carrier 102. In alternative embodiments, the redistribution structure 150 is not overlapped with the underlying dummy die 120A when projected onto the surface of the carrier 102. The redistribution structure 150 may include a plurality of conductive features 152 electrically connected with one another. In some embodiments, the conductive features 152 include conductive lines 152a and conductive vias 152b. The conductive vias 152b may be formed between and in contact with two conductive lines 152a. The conductive features 152 may include tungsten (W), copper (Cu), a copper alloy, aluminum (Al), an aluminum alloy or a combination thereof. In some embodiments, a barrier layer is disposed between the conductive features 152 and the dielectric layer 142 to prevent the material of the conductive features 152 from migrating to the underlying layers. The barrier layer includes Ta, TaN, Ti, TiN, CoW or a combination thereof, for example. In some embodiments, the redistribution structure 150 is formed by a dual damascene process. In alternative embodiments, the redistribution structure 150 is formed by multiple single damascene processes. In alternative embodiments, the redistribution structure 150 is formed by an electroplating process. In some embodiments, as shown in FIG. 3A, a top view of the redistribution structure 150 is checkerboard-like. In alternative embodiments, the redistribution structure 150 have a first redistribution structure and a second redistribution structure, the first redistribution structure is disposed between the second redistribution structure and the functional die 110 and is a fine pitch redistribution layer having smaller line width as compared with the second redistribution layer.

The seal ring 160 is disposed over the dummy die 120A and electrically isolated from the functional die 110. Specifically, the seal ring 160 is disposed in the dielectric layer 142 on the dummy die 120A, and located aside and electrically isolated from the redistribution structure 150. In some embodiments, the seal ring 160 is at least partially overlapped with the dummy die 120A when projected onto the surface of the carrier 102. The seal ring 160 may surround the functional dies 110. In some embodiments, there may be more than one seal ring 160 (although one is shown), wherein outer seal rings encircle inner seal rings. In such embodiments, the seal ring 160 is the outmost seal ring among the plurality of seal rings over the dummy die 120A. The seal ring 160 may be in direct contact with the dummy die 120A. In some embodiments, the seal ring 160 has a grid-like shape, a strip shaped, a ring shape or any suitable shape. The seal ring 160 may have a largest width in a range of about 20 μm to about 100 μm. A distance D1 between the seal ring 160 and the saw street 106C may be in a range of about 40 μm to about 80 μm. The seal ring 160 may have a plurality of seal ring patterns 162 stacked on one another. In some embodiments, the seal ring 160 is formed during the formation of the redistribution structure 150.

Herein, when elements are described as "at substantially the same level", the elements are formed at substantially the same height in the same layer, or having the same positions embedded by the same layer. In some embodiments, the elements at substantially the same level are formed from the same material(s) with the same process step(s). In some embodiments, the tops of the elements at substantially the same level are substantially coplanar. For example, as shown in FIG. 2C, the seal ring 160 is at substantially the same level with the redistribution structure 150. Specifically, the top surfaces of the seal ring patterns 162 may be substantially coplanar with the top surfaces of the conductive features 152 of the redistribution structure 150 respectively.

In some embodiments, the alignment mark 170A is disposed over and electrically isolated from the dummy die 120A, and located between the redistribution structure 150 and the seal ring 160. In some embodiments, the alignment mark 170A is directly disposed on the dummy die 120A. In some embodiments, the alignment mark 170A is electrically isolated from the redistribution structure 150 and the seal ring 160. For example, the alignment mark 170A is at a floating potential. In some embodiments, the alignment mark 170A includes infrared light non-transparent material such as metal. The alignment mark 170A may include tungsten (W), copper (Cu), a copper alloy, aluminum (Al), an aluminum alloy or a combination thereof. In some embodiments, the alignment mark 170A is formed during the formation of the redistribution structure 150. In some embodiments, the alignment mark 170A is at substantially the same level with the conductive line 152a of the redistribution structure 150.

In some embodiments, the alignment mark 170A is cross-shaped, square, rectangular, polygonal, round, elliptical, strip-shaped, T-shaped, L-shaped, box-shaped or any suitable shape. For example, the alignment mark 170A is designed as a cross-shaped pattern, as shown in FIG. 3A. In some embodiments, the alignment mark 170A has a size in a range of about 20 µm×20 µm to about 30 µm×30 µm. A distance D2 between the alignment mark 170A and the redistribution structure 150 may be in a range of about 10 µm to about 30 µm. In some embodiments, the alignment mark 170A is also referred to as a dicing alignment mark, which is used for determining a sawing line. In some embodiments, the alignment mark 170A is further used as an overlay mark. In such embodiments, the alignment mark 170A is detected using infrared light. Specifically, when two layers, elements or dies are stacked on one another, the overlay marks of the two layers, elements or dies can be inspected for overlay accuracy based on whether the upper alignment mark and the lower alignment mark are accurately aligned with one another. In such embodiments, as shown in FIG. 2C, a plurality of the alignment marks 170A are overlapped with one another in a third direction which is perpendicular to the first and second directions. The third direction is Z direction, for example. In some embodiments, the alignment marks 170A are at substantially the same level with the conductive lines 152a of the redistribution structure 150. Specifically, as shown in FIG. 2C, the top surfaces of the alignment marks 170A are substantially coplanar with the top surfaces of the conductive lines 152a of the redistribution structure 150, respectively. However, the disclosure is not limited thereto.

The alignment mark 170B is formed over the dummy die 120B. The alignment mark 170A and the alignment mark 170B are paired and disposed at two opposite sides of the saw street 106C. In some embodiments, the alignment mark 170B is disposed in the dielectric layer 142 over the dummy die 120B and electrically isolated from the dummy die 120B. In some embodiments, the alignment mark 170B is electrically isolated from the functional die 110. The alignment mark 170B may be at a floating potential. In some embodiments, the alignment mark 170B includes infrared light non-transparent material such as metal. The alignment mark 170B may include tungsten (W), copper (Cu), a copper alloy, aluminum (Al), an aluminum alloy or a combination thereof. In some embodiments, the alignment mark 170B is formed simultaneously with the alignment mark 170A. In some embodiments, the alignment mark 170B is at substantially the same level with the alignment mark 170A. Specifically, as shown in FIG. 2C, a top surface of the alignment mark 170B are substantially coplanar with the top surface of the alignment mark 170A. In some embodiments, the alignment mark 170B is further formed during the formation of the redistribution structure 150. In some embodiments, the alignment mark 170B is at substantially the same level with the redistribution structure 150.

In some embodiments, the alignment mark 170B is cross-shaped, square, rectangular, polygonal, round, elliptical, strip-shaped, T-shaped, L-shaped, box-shaped or any suitable shape. A shape of the alignment mark 170B may be different from a shape of the alignment mark 170A. For example, the alignment mark 170A is designed as a cross-shaped pattern while the alignment mark 170B is designed as a square box or square pattern, as shown in FIG. 3A. In some embodiments, the alignment mark 170B has a size in a range of about 20 µm×20 µm to about 30 µm×30 µm.

Figure 4:
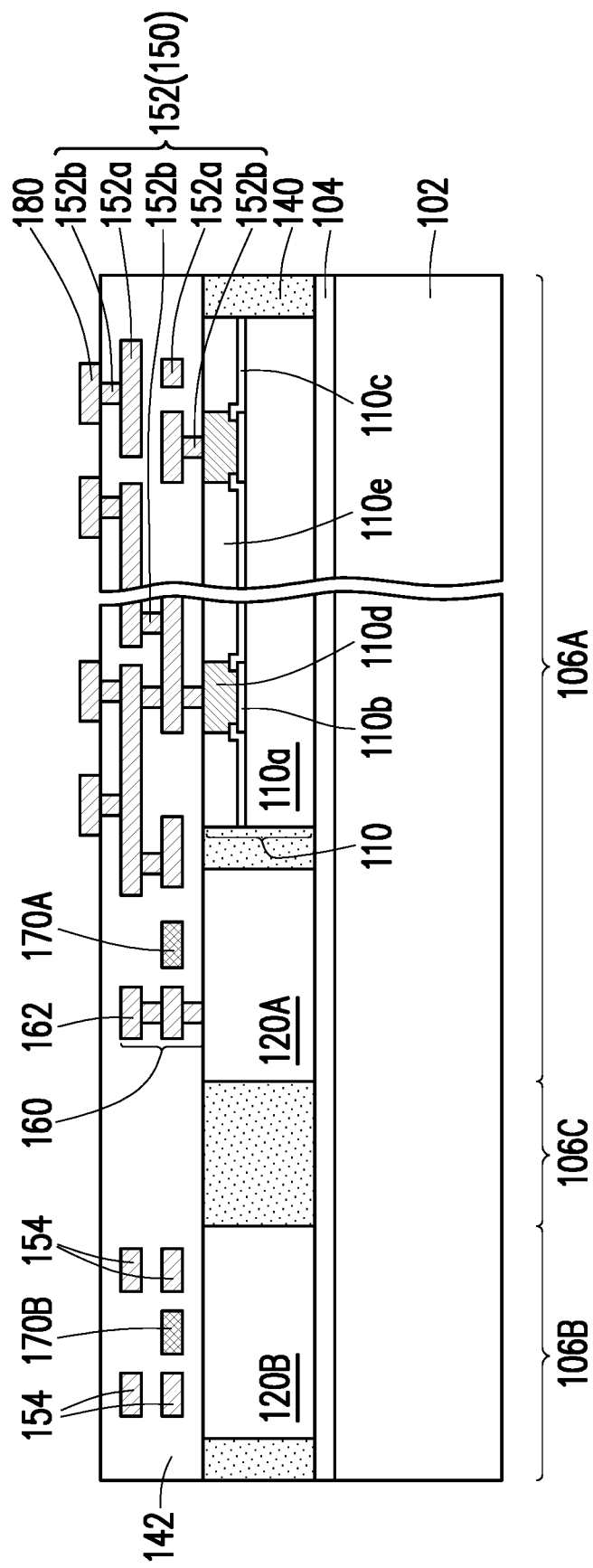
FIG. 4 illustrates a cross-sectional view illustrating a semiconductor structure in accordance with some embodiments of the disclosure.

In some embodiments, the alignment mark 170B is also referred to as a dicing alignment mark, which is used for determining a sawing line. In some embodiments, the alignment mark 170B is further used as an overlay mark. In such embodiments, as shown in FIG. 2C, a plurality of the alignment marks 170B are overlapped with one another in the third direction. In some embodiments, the alignment marks 170B are at substantially the same level with the alignment marks 170A. Specifically, as shown in FIG. 2C, the top surfaces of the alignment marks 170B are substantially coplanar with the top surfaces of the alignment marks 170A. The alignment marks 170B may be at substantially the same level with the conductive lines 152a of the redistribution structure 150. For example, as shown in FIG. 2C, the top surfaces of the alignment marks 170B are substantially coplanar with the top surfaces of the conductive features 152 of the redistribution structure 150 respectively. In alternative embodiments, as shown in FIG. 4, the alignment mark 170A and the alignment mark 170B are merely used for determining a sawing line during the sawing process, there may be only one alignment mark 170A over the dummy die 120A and only one alignment mark 170B over the dummy die 120B. In such embodiments, the alignment mark 170A and the alignment mark 170B are at substantially the same level with any one of the conductive lines 152a of the redistribution structure 150.

In some embodiments, the alignment mark 170B is disposed immediately adjacent to the alignment mark 170A, and the alignment mark 170A and the alignment mark 170B form a pair of alignment marks. For example, as shown in FIG. 3A, a first pair P1 and a second pair P2 of alignment marks 170A, 170B are formed at one side S1 of the periphery region 106B. In some embodiments, at least two pairs of alignment marks 170A, 170B are disposed at one side S1, S2, S3, S4 of the periphery region 106B. More than two pairs of alignment marks 170A, 170B may be disposed at one side S1, S2, S3, S4 of the periphery region 106B.

In some embodiments, as shown in FIGS. 2C and 3A, a plurality of marks 154 are formed aside the alignment mark 170B over the dummy die 120B. The marks 154 are electrically isolated from the redistribution structure 150. The marks 154 are at substantially the same level with the alignment marks 170B. Specifically, as shown in FIG. 2C, top surfaces of the marks 154 are substantially coplanar with the top surfaces of the alignment marks 170B. The marks 154 may be at substantially the same level with the conductive lines 152a of the redistribution structure 150. For example, as shown in FIG. 2C, the top surfaces of the marks 154 are substantially coplanar with the top surfaces of the conductive features 152 of the redistribution structure 150 respectively. In some embodiments, as shown in FIG. 3A, a top view of the marks 154 is checkerboard-shaped, and thus the marks 154 are also referred to as checkerboard marks.

In some embodiments, after forming the redistribution structure 150, the seal ring 160, the alignment mark 170A and the alignment mark 170B, a plurality of conductive pads 180 are formed over the redistribution structure 150. For example, the conductive pads 180 are formed over and electrically connected to the conductive features 152 of the redistribution structure 150. The conductive pads 180 may be under bump metallization (UBM) pads for mounting conductive connectors, such as metal pillars, µ-bumps or the like. The conductive pads 180 include a metal or a metal alloy. The conductive pads 180 includes aluminum, copper, nickel, or an alloy thereof. In alternative embodiments, at least on dummy pad which has no electrical function is formed aside the conductive pads 180.

Figure 2D:
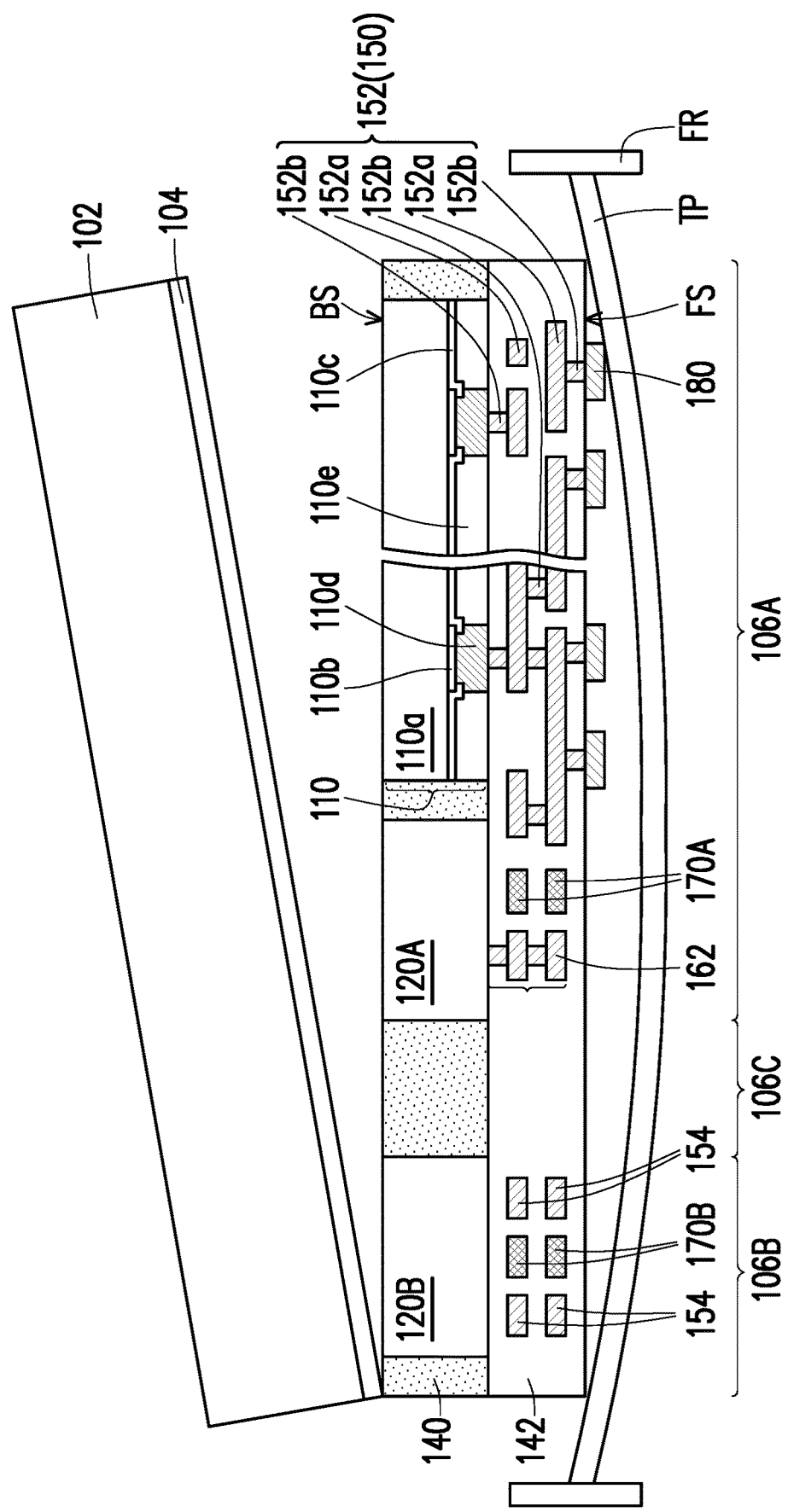

Referring to FIG. 2D, in some embodiments, after forming the conductive pads 180, the structure shown in FIG. 2C is turned upside down and attached to a tape TP supported by a frame FR. As illustrated in FIG. 2D, the carrier 102 is debonded and is separated from the insulating layer 140. In some embodiments, the de-bonding process includes projecting a light such as a laser light or an UV light on the debond layer 104 (e.g., the LTHC release layer) so that the carrier 102 can be easily removed along with the debond layer 104. During the de-bonding step, the tape TP is used to secure the structure before de-bonding the carrier 102 and the debond layer 104.

Figure 2E:
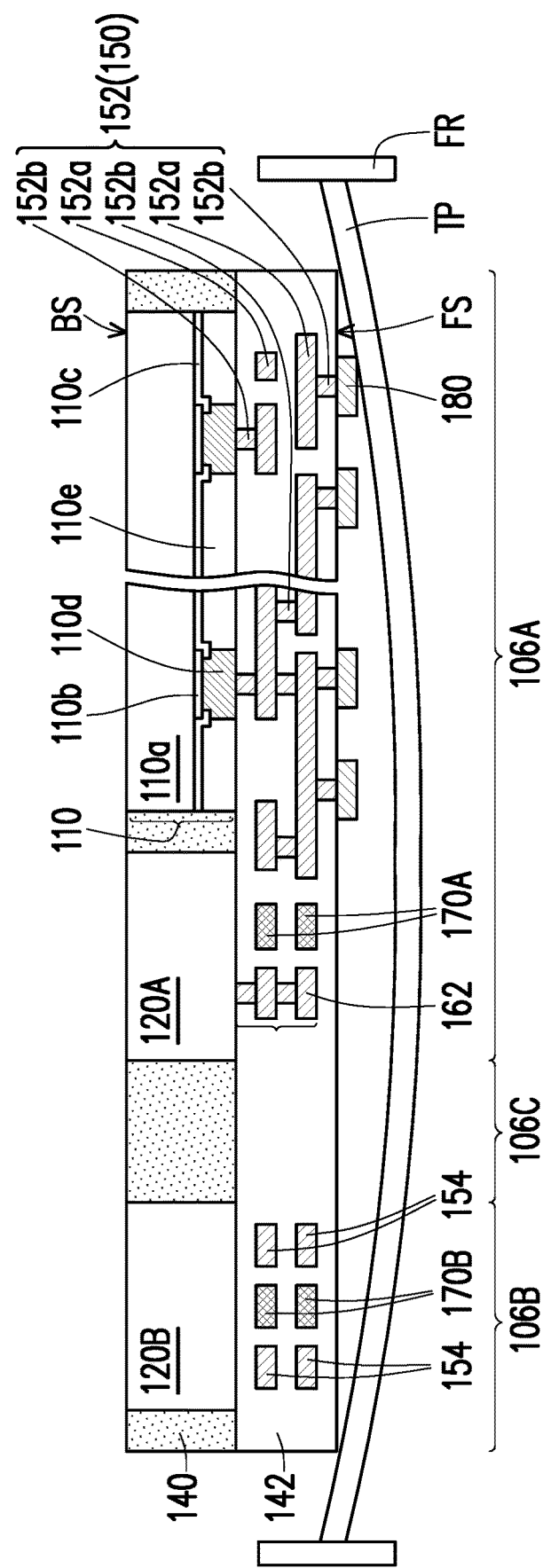

Referring to FIG. 2E, after the de-bonding process, backsides BS of the insulating layer 140, the functional dies 110 and the dummy dies 120A, 120B, 130 are revealed or exposed. The backsides BS is opposite to front sides FS. Thereafter, as shown in FIG. 1B, a plurality of screw holes SH may be formed. In some embodiments, the plurality of screw holes SH penetrates through the dielectric layer 142 and the insulating layer 140. In some embodiments, the screw holes SH are used for fixing various devices and components on the structure to be formed through a plurality of bolts (not shown). For example, the screw holes SH are used for fixing heat dissipation components such as heat sink, cold plate, cool plate, or the like on the structure to be formed. The number of screw holes SH may be adjusted based on product requirement.

Figure 1C:
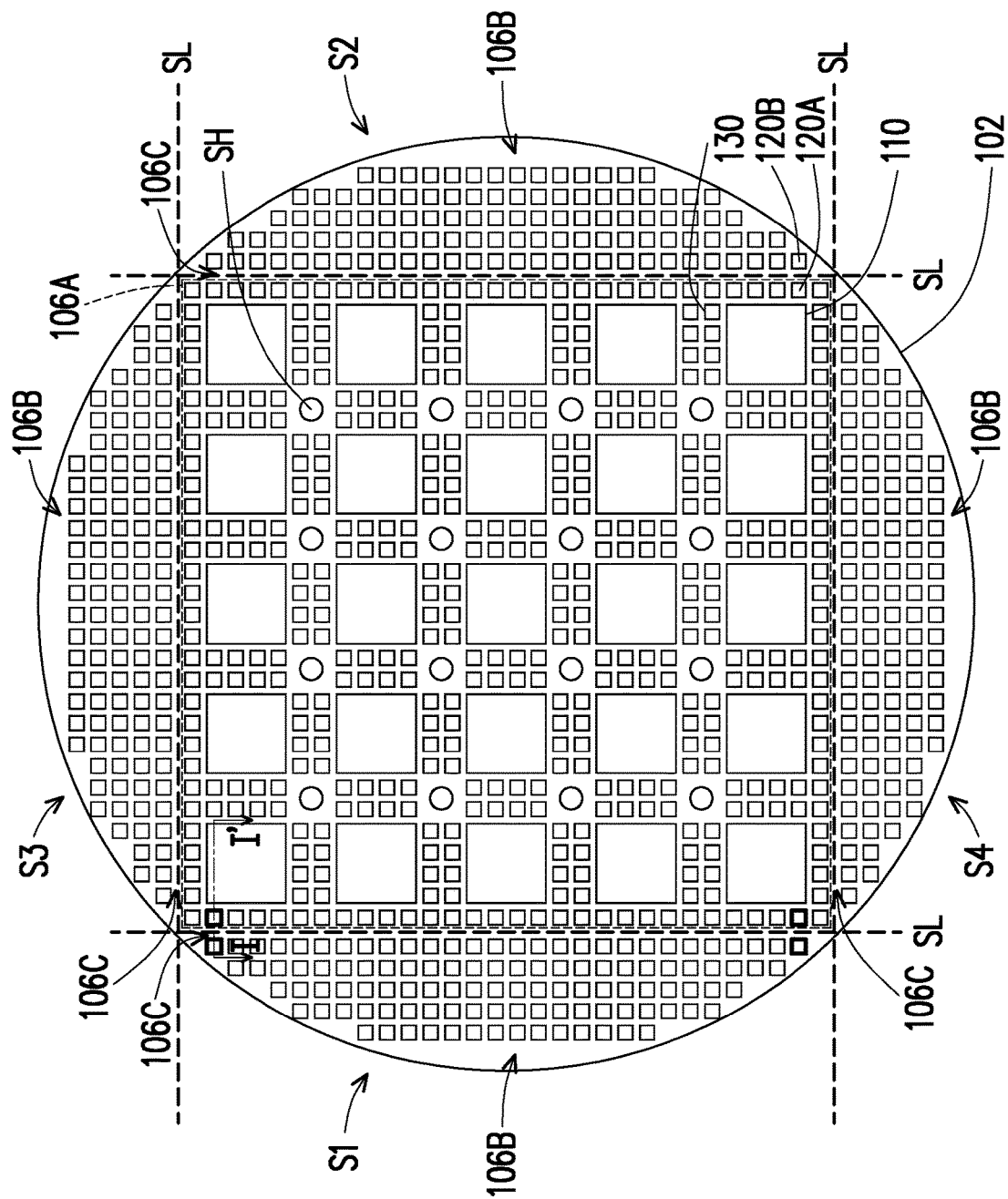
Figure 1D:
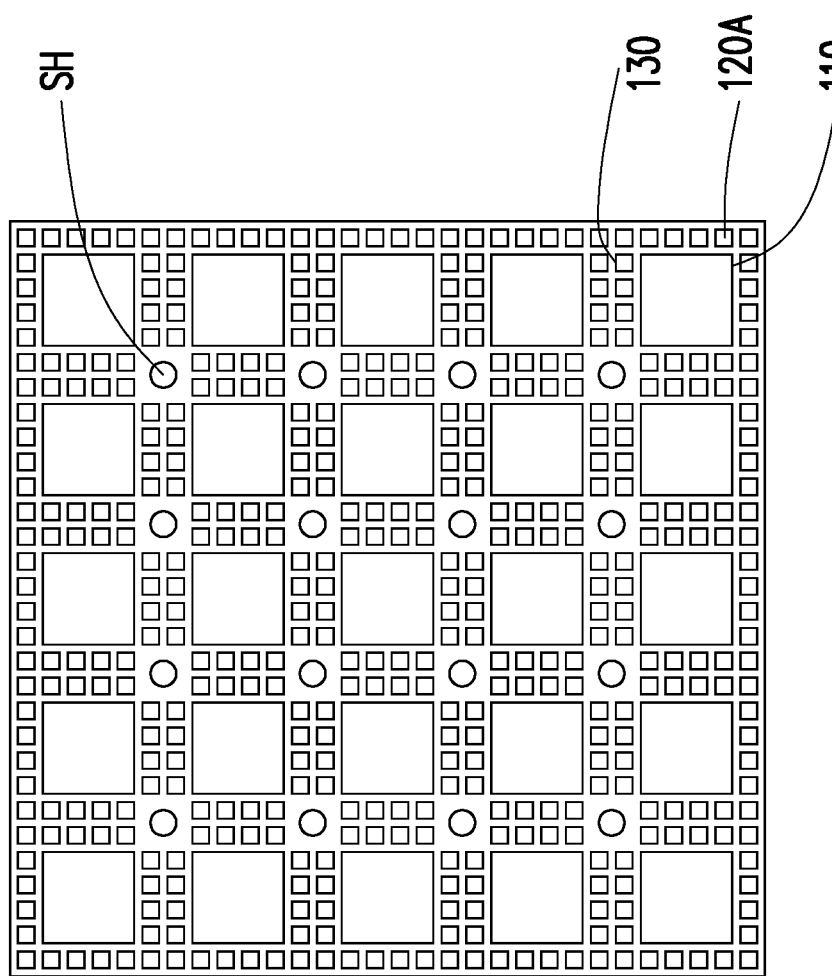
Figure 2F:
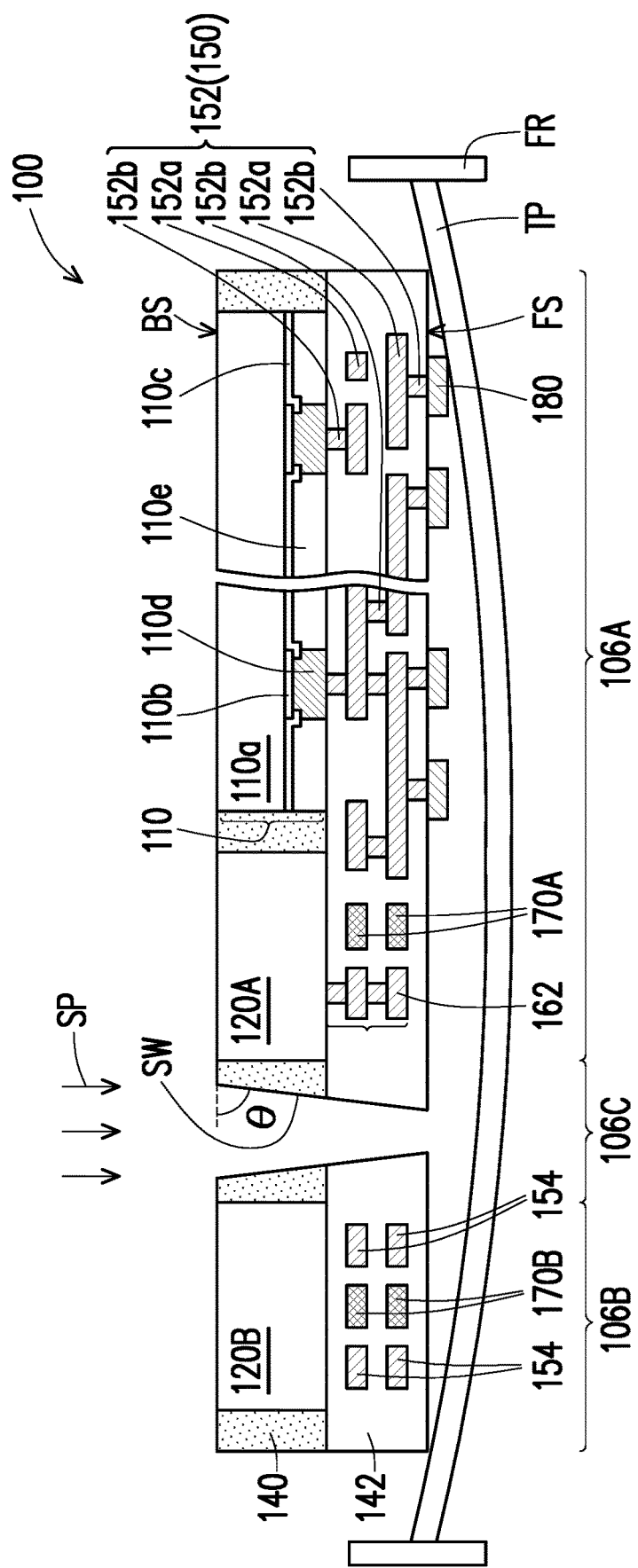

Referring to FIGS. 1C, 2F and 3B, a sawing process SP is performed along sawing lines SL in the saw streets 106C, so as to form a semiconductor wafer 100 of FIG. 1D. In some embodiments, the saw streets 106C are portions of the insulating layer 140 and the dielectric layer 142 between the main region 106A and the periphery region 106B. In some embodiments, each saw street 106C is between the dummy dies 120A, 120B, and is between and adjoining the seal ring 160 and the alignment marks 170B. The saw streets 106C are substantially free from, or fully free from, metal patterns formed therein, wherein the metal patterns include test pads, frame cells, dummy patterns, and the like.

In some embodiments, at least two pairs of alignment marks 170A, 170B is used for guiding backside dicing. First, at least two pairs of alignment marks 170A, 170B are identified. For example, the first pair P1 and the second pair P2 of alignment marks 170A, 170B at the side S1 of the periphery region 106B are identified from the backsides BS of the dummy dies 120A, 102B. Specifically, the first pair P1 and the second pair P2 of alignment marks 170A, 170B may be identified by illuminating the backsides BS of the dummy dies 120A, 102B with a light source, such as infrared light. In some embodiments, the dummy dies 120A, 102B are transparent to the infrared light, and the alignment marks 170A, 170B are non-transparent to the infrared light. In some embodiments, the illuminated alignment marks 170A, 170B form an imaged beam of light replicating the pattern of the alignment marks 170A, 170B. The imaged beam of light is transmitted through the bulk thickness of the structure of FIG. 2F and exits the front side of the structure to be detected by an infrared image detector (not shown). Thereby, the images of the alignment marks 170A, 170B are obtained. In some embodiments, the light source is disposed beneath the structure of FIG. 2F, and the infrared image detector is disposed above the front side of the structure of FIG. 2F. The infrared image detector is an infrared microscope, for example. In some embodiments, the sawing process SP is also referred to as a backside IR alignment sawing process.

Then, a position of a sawing line SL is determined by the pairs of alignment marks 170A, 170B at the same side S1, S2, S3, S4 of the periphery region 106B. The sawing line SL is also referred to as a sawing line or a sawing reference line. Specifically, as shown in FIG. 3B, a connection line CL1 is formed between a center C1 of the alignment mark 170A and a center C2 of the alignment mark 170B of the first pair P1 at the side S1, and a connection line CL2 is formed between a center C1 of the alignment mark 170A and a center C2 of the alignment mark 170B of the second pair P2 at the side S1. The position of the sawing line SL is determined by connecting a middle point of the connection line CL1 and a middle point of the connection line CL2. In some embodiments, the sawing line SL is also a perpendicular bisector of the connection line CL1 and a perpendicular bisector of the connection line CL2. The positions of the sawing lines SL in the saw streets 106C at the sides S2, S3, S4 may be determined as described above. After the positions of the sawing lines SL are determined, the sawing process SP is performed along the sawing lines SL, so as to form the semiconductor wafer 100 of FIGS. 1D and 2F. In some embodiments, during the sawing process SP, a blade (not shown) is used and passes through the dielectric layer 142 and the insulating layer 140 along the sawing line SL. In some embodiments, as shown in FIG. 2F, since a sawing direction is from the backside BS to the front side FS of the functional die 110, an acute angle θ is formed between an edge of the blade and the insulating layer 140. In some embodiments, a width of the saw street 106C is in a range of about 270 μm to 330 μm, and a width of the blade is in a range of about 180 μm to 240 μm. The acute angle θ is formed between an extending line of the backside BS and a formed sidewall SW of the insulating layer 140. The acute angle θ is smaller than 30 degrees, for example. In some embodiments, the sawing process SP is performed after forming the screw holes SH. However, the disclosure is not limited thereto. In alternative embodiments, the sawing process SP is performed before forming the screw holes SH.

Figure 2G:
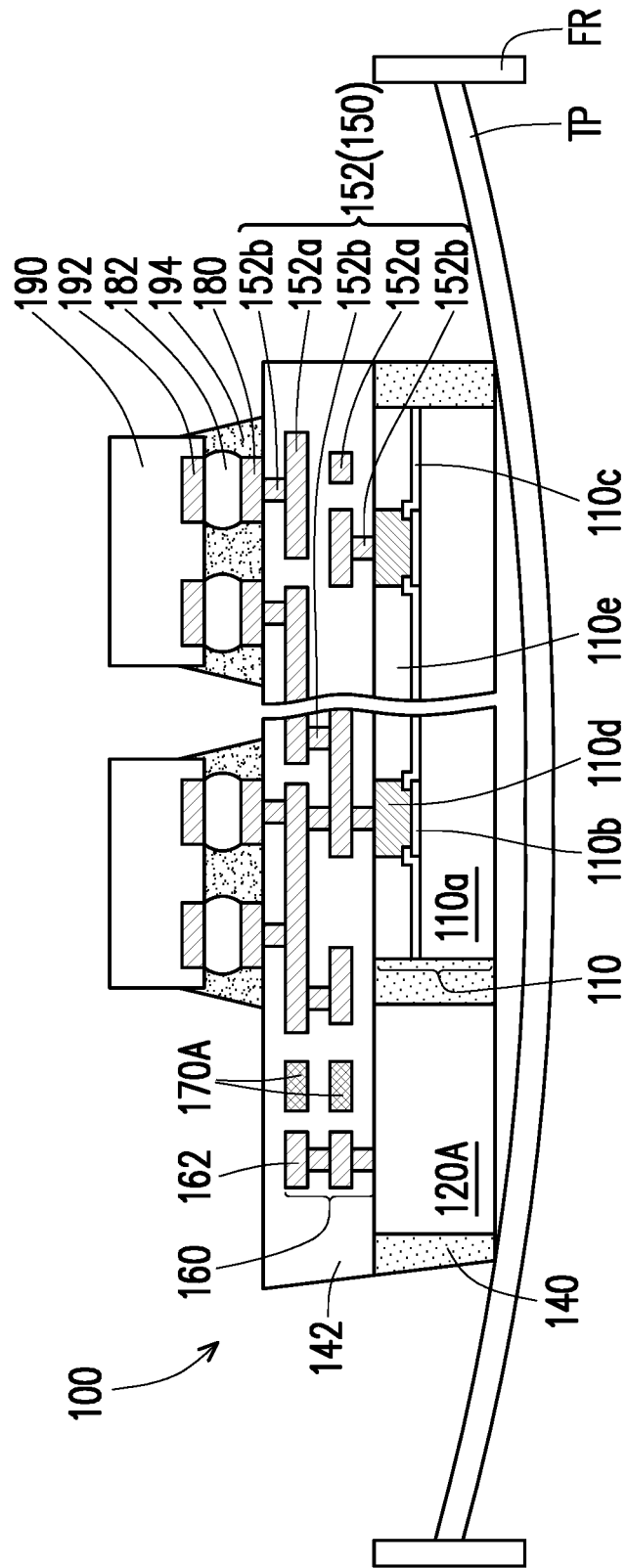
Figure 2H:
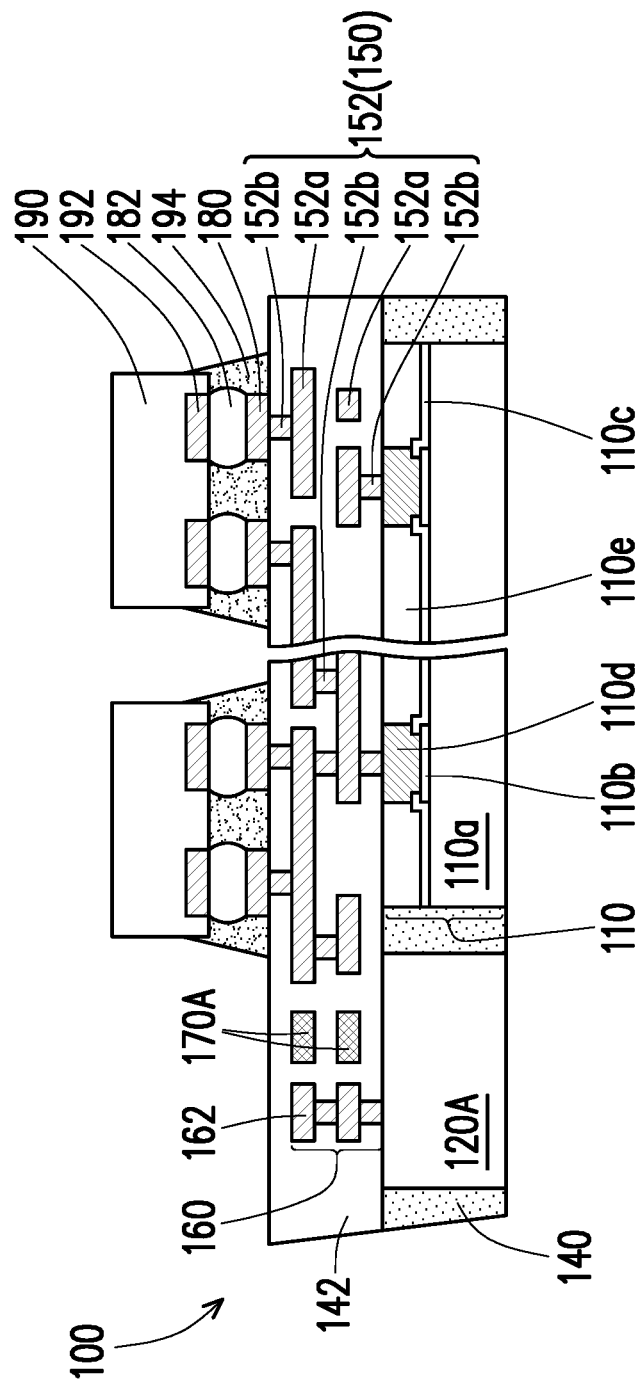

Referring to FIG. 2G, the semiconductor wafer 100 illustrated in FIG. 2F is turned upside down and re-mounted on the tape TP so that the conductive pads 180 are revealed. Subsequently, a plurality of electrical connectors 182 are formed on the redistribution structure 150, and a plurality of surface mount components 190 are electrically and physically connected to the redistribution structure 110 through the electrical connectors 182. The surface mount components 190 may be integrated passive devices, DRAM (Dynamic Random Access Memory) devices, voltage regulator modules, electrical capacitance devices, or the like. The disclosure is not limited thereto. In some embodiments, a material of the electrical connectors 182 include metallic materials such as copper, aluminum, or the like. In some embodiments, the electrical connectors 182 are formed on the conductive pads 180 through a reflow process, and the surface mount components 190 are bonded to the electrical connectors 182 through bonding pads 192. In some embodiments, the surface mount components 190 are disposed on the semiconductor wafer 100, and electrically connected to the semiconductor wafer 100 through the electrical connectors 182. The surface mount components 190 may be disposed on the semiconductor wafer 100 within an edge of the semiconductor wafer 100, and being overlapped with the semiconductor wafer 100. In alternative embodiments, an edge of one of the surface mount components 190 is overhanging the edge of the semiconductor wafer 100. In some embodiments, an underfill 194 is formed to cover the electrical connectors 182. For example, the underfill 194 fills the spaces between the surface mount components 190 and the redistribution structure 150 to cover the electrical connectors 182. After forming the underfill 194, the structure is removed from the tape TP, and a semiconductor structure of FIG. 2H according to some embodiments of the disclosure is accomplished.

Figure 5:
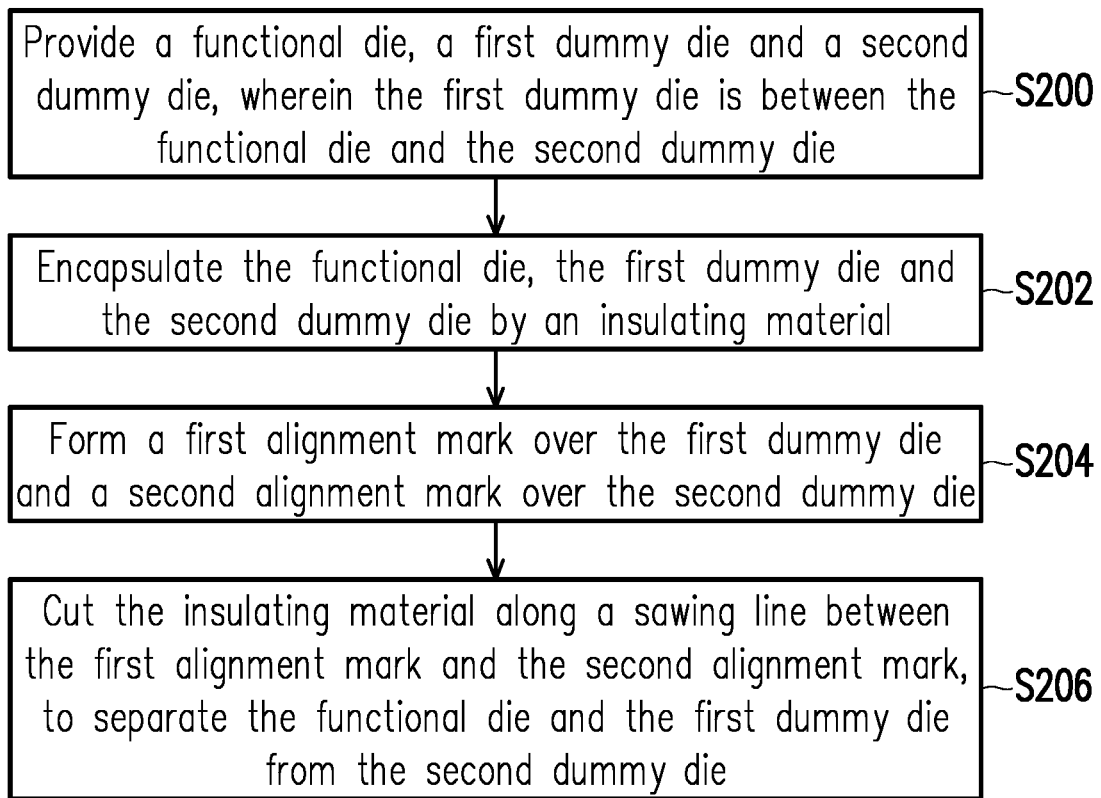
FIG. 5 illustrates a method of forming a semiconductor structure in accordance with some embodiments of the disclosure.

FIG. 5 illustrates a method of forming a semiconductor structure in accordance with some embodiments of the disclosure. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act S200, a functional die, a first dummy die and a second dummy die are provided, wherein the first dummy die is between the functional die and the second dummy die. FIG. 1A and FIG. 2A illustrate varying views corresponding to some embodiments of act S200.

At act S202, the functional die, the first dummy die and the second dummy die are encapsulated by an insulating material. FIG. 2B illustrates a cross-sectional view corresponding to some embodiments of act S202.

At act S204, a first alignment mark is formed over the first dummy die and a second alignment mark is formed over the second dummy die. FIG. 2C and FIG. 3A illustrates varying views corresponding to some embodiments of act S204.

At act S206, the insulating material is cut along a sawing line between the first alignment mark and the second alignment mark, to separate the functional die and the first dummy die from the second dummy die. FIGS. 1C, 1D, 2F, 2F and 3B illustrates varying views corresponding to some embodiments of act S206.

Figure 6:
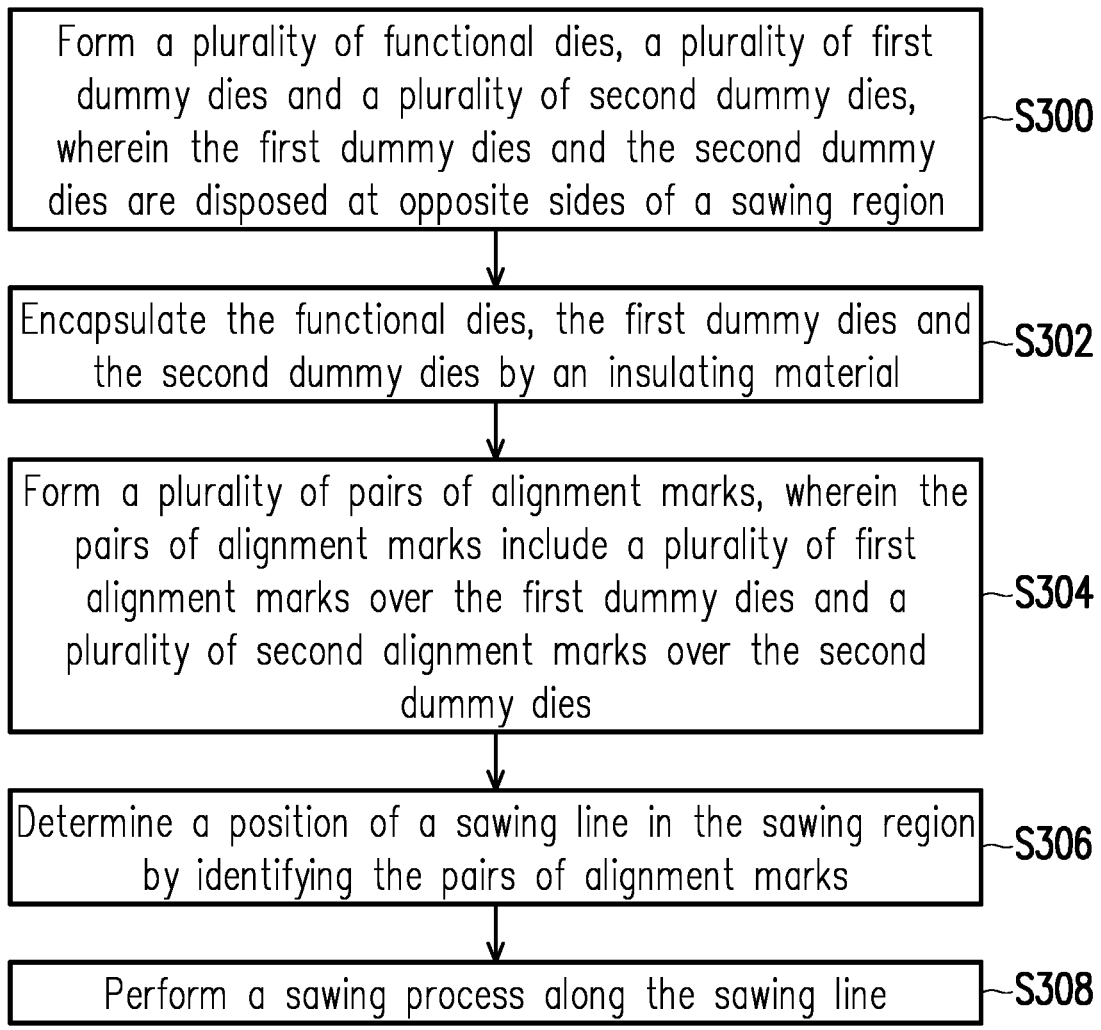
FIG. 6 illustrates a method of forming a semiconductor structure in accordance with some embodiments of the disclosure.

FIG. 6 illustrates a method of forming a semiconductor structure in accordance with some embodiments of the disclosure. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act S300, a plurality of functional dies, a plurality of first dummy dies and a plurality of second dummy dies are formed, wherein the first dummy dies and the second dummy dies are disposed at opposite sides of a sawing region. FIG. 1A and FIG. 2A illustrate varying views corresponding to some embodiments of act S300.

At act S302, the functional dies, the first dummy dies and the second dummy dies are encapsulated by an insulating material. FIG. 2B illustrates a cross-sectional view corresponding to some embodiments of act S302.

At act S304, a plurality of pairs of alignment marks are formed, and the pairs of alignment marks include a plurality of first alignment marks over the first dummy dies and a plurality of second alignment marks over the second dummy dies. FIG. 2C and FIG. 3A illustrates varying views corresponding to some embodiments of act S304.

At act S306, a position of a sawing line in the sawing region is determined by identifying the pairs of alignment marks. FIGS. 1C, 1D, 2F, 2F and 3B illustrates varying views corresponding to some embodiments of act S306.

At act S308, a sawing process is performed along the sawing line. FIGS. 1C, 1D, 2F, 2F and 3B illustrates varying views corresponding to some embodiments of act S308.

Figure 7A:
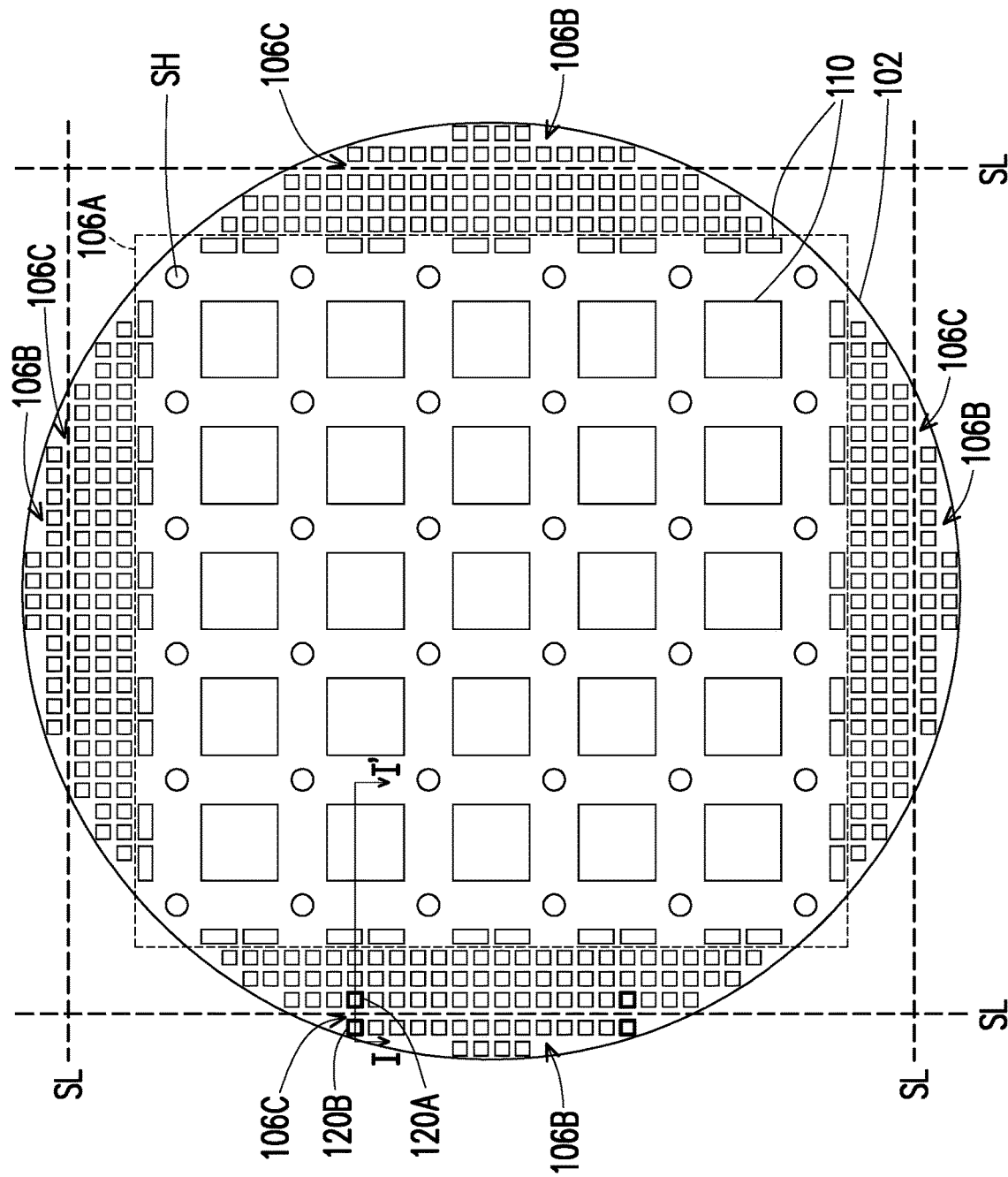
FIG. 7A illustrates a simplified top view of a semiconductor structure in accordance with some embodiments of the disclosure.
Figure 7B:
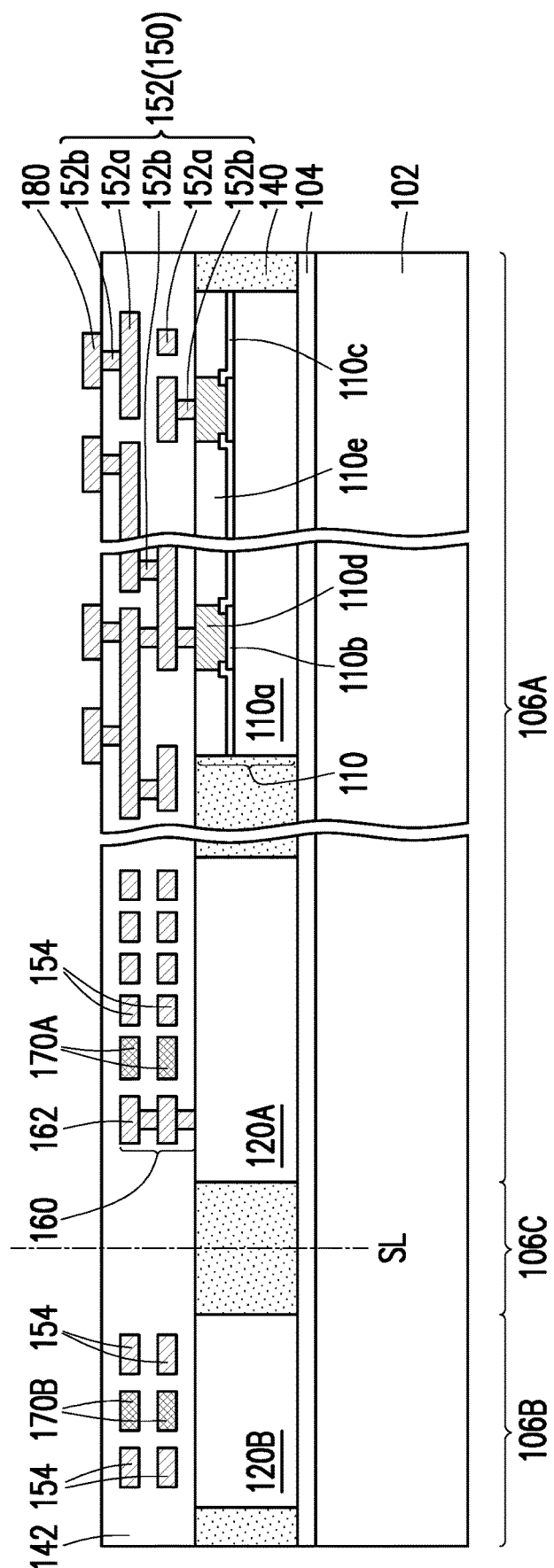
FIG. 7B illustrates a schematic cross-sectional view of a semiconductor structure along line I-I' of FIG. 7A.
Figure 7C:
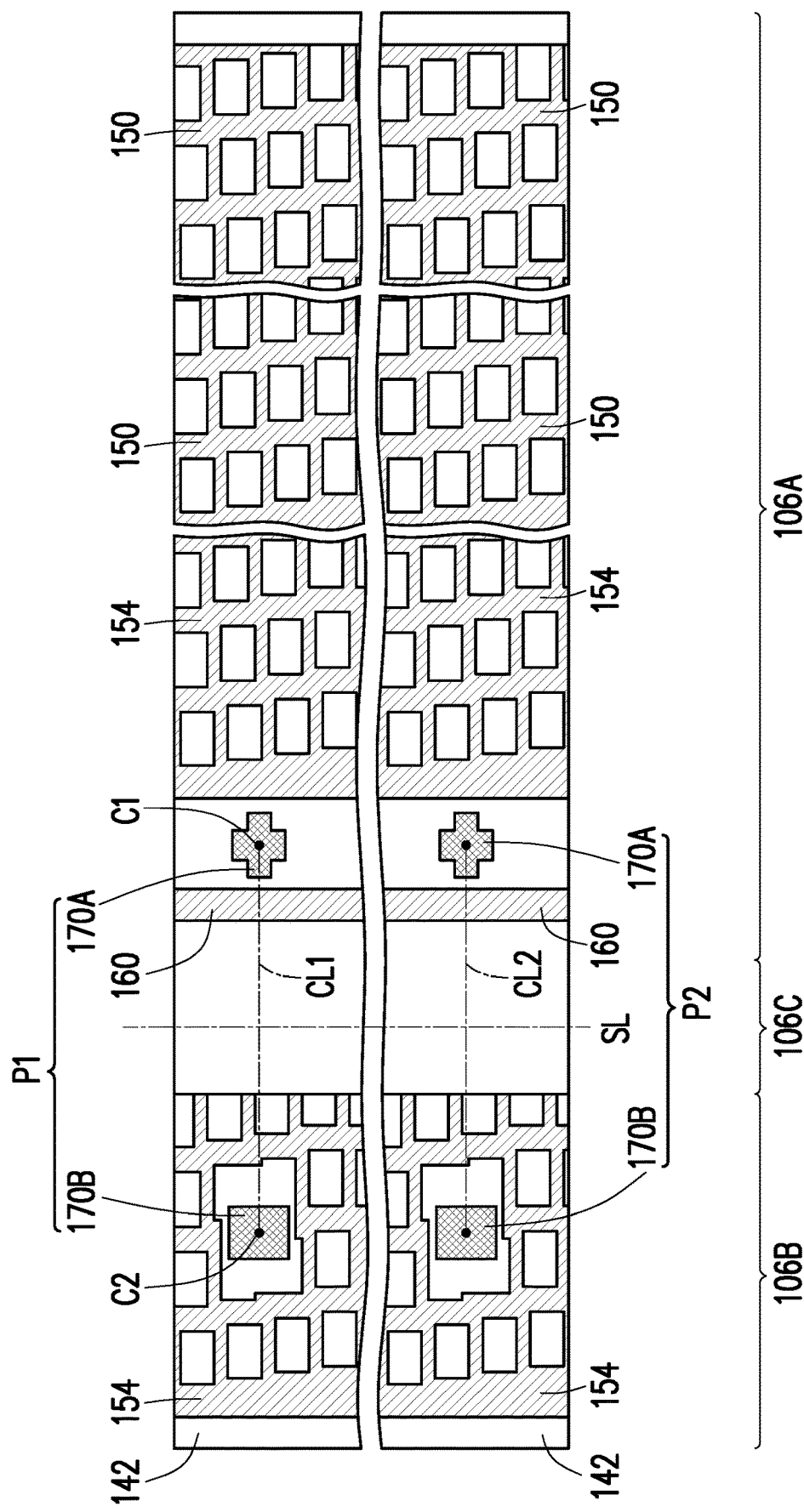
FIG. 7C is a simplified and partially enlarged view of one side of a periphery region of FIG. 7A.

FIG. 7A illustrates a simplified top view of a semiconductor structure in accordance with some embodiments of the disclosure, FIG. 7B illustrates a schematic cross-sectional view of a semiconductor structure along line I-I' of FIG. 7A, and FIG. 7C is a simplified and partially enlarged view of one side of a periphery region of FIG. 7A. The structure is similar to the structure of FIG. 1C, FIG. 2C and FIG. 3B, and difference lies in the arrangement of the dummy dies. Specifically, as shown in FIG. 7A, a plurality of dummy dies 120A are disposed between the outermost functional die 110 and the dummy dies 120B. In some embodiments, the functional dies 110 have different sizes. For example, the functional dies 110 have smaller size surround the functional dies 110 have larger size. As shown in FIG. 7B, the seal ring 160, the alignment mark 170A and a plurality of marks 154 may be formed over the same dummy die 120A, and the alignment mark 170A may be disposed between the seal ring 160 and the redistribution structure 150 over the functional die 110. The alignment mark 170A is disposed over the dummy die 120B. In some embodiments, as shown in FIG. 7B and FIG. 7C, the alignment mark 170A and the alignment mark 170B are disposed at opposite sides of the saw street 106C, and the sawing line SL in the saw street 106C is determined by at least two pairs of alignment marks at the same side. Specifically, a connection line CL1 is formed between a center C1 of the alignment mark 170A and a center C2 of the alignment mark 170B of the first pair P1 at the side S1, and a connection line CL2 is formed between a center C1 of the alignment mark 170A and a center C2 of the alignment mark 170B of the second pair P2 at the side S1. The position of the sawing line SL is determined by connecting a middle point of the connection line CL1 and a middle point of the connection line CL2.

In some embodiments, the sawing process is performed from the backside by identifying pairs of the alignment marks in the chamfer edge. Therefore, the sawing accuracy may be improved. In addition, in some embodiments, the tape is prevented from being broken, the humidity issue caused by the sawing process is avoided, and the joint components such as surface mount components are prevented from being damaged when the backside sawing process is performed.

In accordance with some embodiments of the disclosure, a semiconductor structure includes a functional die, a dummy die, a redistribution structure, a seal ring and an alignment mark. The dummy die is electrically isolated from the functional die. The redistribution structure is disposed over and electrically connected to the functional die. The seal ring is disposed over the dummy die. The alignment mark is between the seal ring and the redistribution structure, wherein the alignment mark is electrically isolated from the dummy die, the redistribution structure and the seal ring. The insulating layer encapsulates the functional die and the dummy die.

In accordance with some embodiments of the disclosure, a method of manufacturing a semiconductor structure includes the following steps. A functional die, a first dummy die and a second dummy die are provided, wherein the first dummy die is between the functional die and the second dummy die. The functional die, the first dummy die and the second dummy die are encapsulated by an insulating material. A first alignment mark is formed over the first dummy die and a second alignment mark is formed over the second dummy die. The insulating material is cut along a sawing line between the first alignment mark and the second alignment mark, to separate the functional die and the first dummy die from the second dummy die.

In accordance with some embodiments of the disclosure, a method of manufacturing a semiconductor structure includes the following steps. A plurality of functional dies, a plurality of first dummy dies and a plurality of second dummy dies are formed, wherein the first dummy dies and the second dummy dies are disposed at opposite sides of a sawing region. The functional dies, the first dummy dies and the second dummy dies are encapsulated by an insulating material. A plurality of pairs of alignment marks are formed, wherein the pairs of alignment marks include a plurality of first alignment marks over the first dummy dies and a plurality of second alignment marks over the second dummy dies. A position of a sawing line in the sawing region is determined by identifying the pairs of alignment marks. A sawing process is performed along the sawing line.

In accordance with some embodiments of the disclosure, a semiconductor structure includes a functional die, a dummy die, a conductive feature, a seal ring and an alignment mark. The dummy die is electrically isolated from the functional die. The conductive feature is electrically connected to the functional die. The seal ring is disposed aside the conductive feature. The alignment mark is disposed between the seal ring and the conductive feature, and the alignment mark is electrically isolated from the dummy die, the conductive feature and the seal ring.

In accordance with some embodiments of the disclosure, a semiconductor structure includes a die, a plurality of conductive lines, a plurality of conductive vias, a seal ring and a plurality of alignment marks. The conductive lines and the conductive vias are alternately arranged and electrically connected to the die. The seal ring is disposed aside the conductive lines and the conductive vias. The alignment marks are disposed between the seal ring and the conductive lines and between the seal ring and the conductive vias, and the alignment mark is electrically isolated from the conductive lines, the conductive vias and the seal ring.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A semiconductor structure, comprising:
   a functional die;
   a dummy die, electrically isolated from the functional die;
   a conductive feature, electrically connected to the functional die;
   a seal ring aside the conductive feature;
   an alignment mark between the seal ring and the conductive feature, wherein the alignment mark is electrically isolated from the dummy die, the conductive feature and the seal ring.

2. The semiconductor structure according to claim 1, wherein a material of the alignment mark is the same as a material of the conductive feature and a material of the seal ring.

3. The semiconductor structure according to claim 1 further comprising a dielectric layer encapsulating the conductive feature, the seal ring and the alignment mark.

4. The semiconductor structure according to claim 3 further comprising an encapsulant encapsulating the functional die and the dummy die.

5. The semiconductor structure according to claim 4, wherein a first sidewall of the dielectric layer is substantially vertical and continuous with a first sidewall of the encapsulant, and a second sidewall of the dielectric layer is inclined and continuous with a second sidewall of the encapsulant.

6. The semiconductor structure according to claim 4, wherein a width of the encapsulant increases as the encapsulant becomes closer to the dielectric layer, and a width of the dielectric layer decreases as the dielectric layer becomes closer to the encapsulant.

7. The semiconductor structure according to claim 1, wherein the seal ring and the alignment mark are disposed within a periphery of the dummy die.

8. A semiconductor structure, comprising:
   a functional die;
   a dummy die, electrically isolated from the functional die;
   a redistribution structure, disposed over and electrically connected to the functional die;
   a seal ring, disposed over the dummy die;
   an alignment mark between the seal ring and the redistribution structure, wherein the alignment mark is electrically isolated from the dummy die, the redistribution structure and the seal ring; and
   an insulating layer, encapsulating the functional die and the dummy die.

9. The semiconductor structure according to claim 8, wherein a surface of the alignment mark is substantially coplanar with surfaces of the redistribution structure and the seal ring.

10. The semiconductor structure according to claim 8, wherein a material of the alignment mark is the same as a material of the redistribution structure and a material of the seal ring.

11. The semiconductor structure according to claim 8 further comprising a dielectric layer over the insulating layer, the functional die and the dummy die, wherein the redistribution structure, the seal ring and the alignment mark are disposed in the dielectric layer.

12. The semiconductor structure according to claim 8, wherein the redistribution structure comprises a plurality of first patterns stacked on one another, the seal ring comprises a plurality of second patterns stacked on one another, and surfaces of the plurality of first patterns are substantially coplanar with surfaces of the plurality of second patterns respectively.

13. The semiconductor structure according to claim 8, wherein from a top view, the alignment mark is cross-shaped, square, rectangular, polygonal, round, elliptical, strip-shaped, T-shaped, L-shaped or box-shaped.

14. The semiconductor structure according to claim 8, wherein an angle formed between an extending line of a surface of the insulating layer and a sidewall of the insulating layer is smaller than 30 degrees, and the redistribution structure is disposed over the surface of the insulating layer.

15. A semiconductor structure, comprising:
    a die;

a plurality of conductive lines and a plurality of conductive vias, alternately arranged and electrically connected to the die;

a seal ring aside the conductive lines and the conductive vias; and a plurality of alignment marks between the seal ring and the conductive lines and between the seal ring and the conductive vias, wherein the alignment marks are electrically isolated from the conductive lines, the conductive vias and the seal ring, and the alignment marks are separated and stacked over one another.

16. The semiconductor structure according to claim 15, wherein the alignment marks are electrically floating.

17. The semiconductor structure according to claim 15, wherein the alignment marks are respectively at substantially the same height with the conductive lines.

18. The semiconductor structure according to claim 15, wherein the seal ring comprises a plurality of patterns stacked on one another, and top surfaces of the alignment marks are respectively coplanar with top surfaces of the conductive lines and the patterns.

19. The semiconductor structure according to claim 15, wherein a sidewall of one of the alignment marks is substantially flush with a sidewall of another of the alignment marks.

20. The semiconductor structure according to claim 15, further comprising a dielectric layer between the alignment marks.

* * * * *